United States Patent
Saito et al.

(10) Patent No.: US 10,014,145 B2
(45) Date of Patent: Jul. 3, 2018

(54) VACUUM EXHAUST METHOD

(71) Applicant: TOKYO ELECTRON LIMITED, Tokyo (JP)

(72) Inventors: Tomohiro Saito, Yamanashi (JP); Tadashi Mitsunaga, Yamanashi (JP); Kouji Maeda, Yamanashi (JP); Tetsuya Miyashita, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/595,290

(22) Filed: May 15, 2017

(65) Prior Publication Data
US 2017/0345609 A1  Nov. 30, 2017

(30) Foreign Application Priority Data
May 24, 2016 (JP) .................. 2016-103607

(51) Int. Cl.
| | |
|---|---|
| *H01J 11/52* | (2012.01) |
| *H01J 41/16* | (2006.01) |
| *H01J 21/18* | (2006.01) |
| *H01J 11/46* | (2012.01) |
| *H01J 41/12* | (2006.01) |
| *H01J 21/02* | (2006.01) |
| *H01J 11/20* | (2012.01) |

(52) U.S. Cl.
CPC ............... *H01J 11/52* (2013.01); *H01J 11/46* (2013.01); *H01J 21/18* (2013.01); *H01J 41/16* (2013.01); *H01J 11/20* (2013.01); *H01J 21/02* (2013.01); *H01J 41/12* (2013.01)

(58) Field of Classification Search
CPC .. H01J 11/52; H01J 11/20; H01J 11/46; H01J 21/18; H01J 21/02; H01J 41/16; H01J 41/12; H01J 7/18; H01J 61/26
See application file for complete search history.

(56) References Cited

U.S. PATENT DOCUMENTS

| | | | | |
|---|---|---|---|---|
| 5,041,147 | A * | 8/1991 | Knize | B01D 59/26 95/116 |
| 5,161,955 | A * | 11/1992 | Danielson | B01J 3/006 417/51 |
| 6,172,460 | B1 * | 1/2001 | Damen | G02F 1/13334 313/481 |
| 2006/0043871 | A1 * | 3/2006 | Kamio | H01J 7/14 313/495 |
| 2007/0205720 | A1 * | 9/2007 | Sparks | F04B 37/04 313/553 |
| 2016/0136612 | A1 * | 5/2016 | Sato | B01J 20/186 428/446 |

FOREIGN PATENT DOCUMENTS

JP  H06-306601  11/1994

* cited by examiner

*Primary Examiner* — Joseph L Williams
*Assistant Examiner* — Jose M Diaz

(57) ABSTRACT

A vacuum exhaust method is for decreasing a pressure in a processing chamber in which a mounting table configured to mount thereon a substrate is provided by using a gas exhaust unit. The vacuum exhaust method includes mounting a non-evaporated getter (NEG) on the mounting table, and adsorbing an active gas in the processing chamber on the NEG mounted on the mounting table. In the adsorbing the active gas, the NEG is maintained at a predetermined temperature.

12 Claims, 4 Drawing Sheets

VACUUM EXHAUST METHOD

CROSS-REFERENCE TO RELATED APPLICATION

This application claims priority to Japanese Patent Application No. 2016-103607 filed on May 24, 2016, the entire contents of which are incorporated herein by reference.

FIELD OF THE INVENTION

The disclosure relates to a vacuum exhaust method.

BACKGROUND OF THE INVENTION

There is known a substrate processing apparatus for performing processing on a substrate loaded into a processing chamber that can be evacuated by a vacuum pump such as a cryo pump or the like. In such a substrate processing apparatus, a desired vacuum level may not be obtained even if a pressure in the processing chamber is decreased by the vacuum pump due to a decrease in evacuation performance of the vacuum pump, the effect of impurities adsorbed onto an inner surface of the processing chamber, or the like.

Therefore, there is conventionally known, as a method of improving a vacuum level in a processing chamber, a method of providing a cooling panel and a getter pump as an auxiliary pump, in addition to a conventional vacuum pump, in a processing chamber (see, e.g., Japanese Patent Application Publication No. H6-306601) or a method of baking a processing chamber.

However, in the method of adding the auxiliary pump, a downtime is increased due to set-up or modification of a device which is required to add the auxiliary pump. Further, in the method of baking the processing chamber, a long period of time is required to improve a vacuum level in the processing chamber.

SUMMARY OF THE INVENTION

In view of the above, the disclosure provides a vacuum exhaust method capable of improving a vacuum level in a processing chamber within a short period of time.

In accordance with an aspect of the present disclosure, there is provided a vacuum exhaust method for decreasing a pressure in a processing chamber, in which a mounting table configured to mount thereon a substrate is provided, by using a gas exhaust unit, the method including: mounting a non-evaporated getter (NEG) on the mounting table; and adsorbing an active gas in the processing chamber on the NEG mounted on the mounting table.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Figure 1:
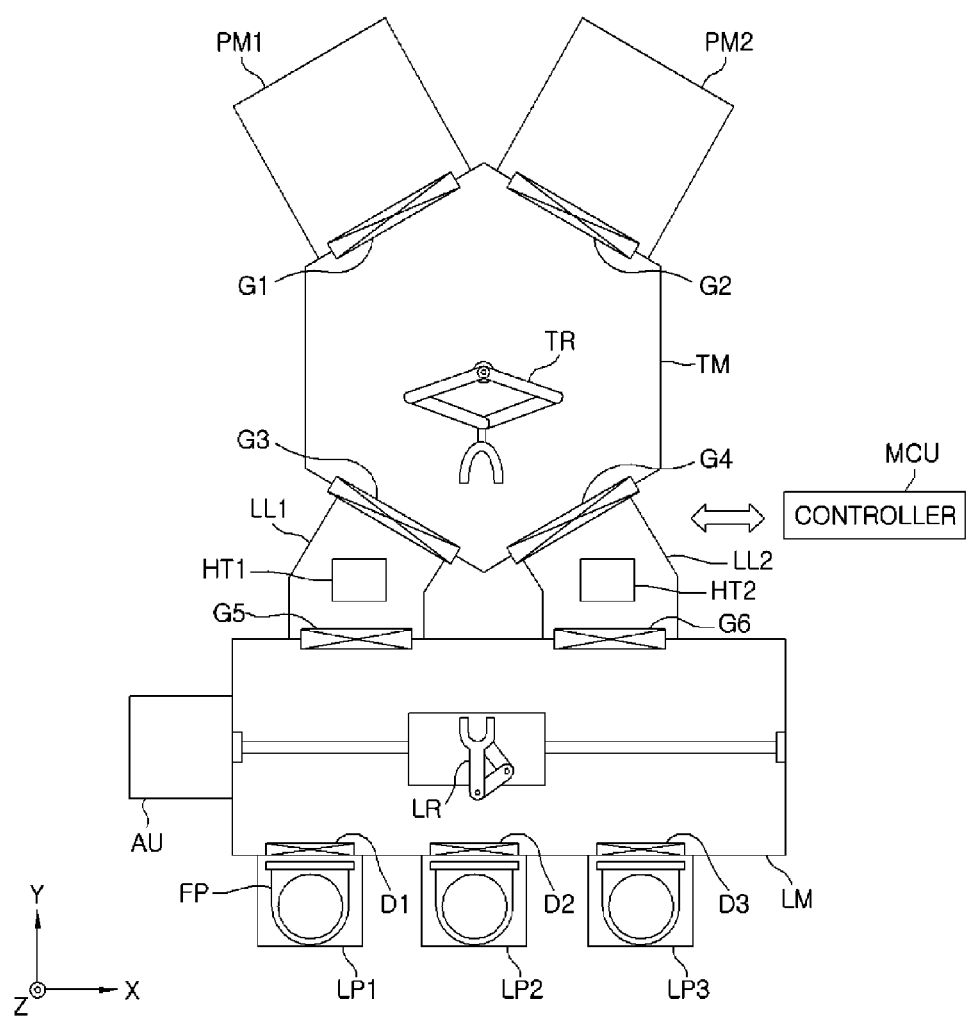
FIG. 1 schematically shows a substrate processing system according to an embodiment.

Hereinafter, embodiments will be described with reference to the accompanying drawings. Like reference numerals will be used for like parts having substantially the same functions throughout the specification and the drawings, and redundant description thereof will be omitted.

A vacuum exhaust method according to an embodiment improves a vacuum level in a processing chamber by loading a non-evaporated getter into a processing chamber that can be evacuated by a gas exhaust unit and adsorbing an active gas in the processing chamber onto the non-evaporated getter. The vacuum exhaust method according to an embodiment can be applied to a substrate processing apparatus for performing processing, e.g., film formation, etching, or the like, on a substrate. The vacuum exhaust method according to an embodiment can also be applied to a transfer chamber for transferring a substrate or the like. In this specification, the non-evaporated getter is also referred to as "NEG".

In the following, a case in which the vacuum exhaust method according to an embodiment is applied to a substrate processing system including a film forming apparatus as an example of a substrate processing apparatus will be described as an example.

(Substrate Processing System)

The substrate processing system according to an embodiment will be described. FIG. 1 schematically shows the substrate processing system according to an embodiment.

As shown in FIG. 1, the substrate processing system includes a transfer module TM, process modules PM1 and PM2, load-lock modules LL1 and LL2, and a loader module LM.

The transfer module TM is a substantially hexagonal module for transferring a wafer as an example of a substrate between the process modules PM1 and PM2 and the load-lock modules LL1 and LL2. A transfer unit TR is provided in the transfer module TM. The transfer unit TR transfers the wafer between the process modules PM1 and PM2 and the load-lock modules LL1 and LL2.

The process modules PM1 and PM2 are provided at two sides of the transfer module TM and perform processing such as film formation, etching or the like on a wafer. The process modules PM1 and PM2 will be described in detail later.

The load-lock modules LL1 and LL2 are provided other two sides of the transfer module TM and transfer the wafer between the transfer module TM and the loader module LM. Heating units HT1 and HT2 such as lamp heaters or the like are provided in the load-lock modules LL1 and LL2, respectively. The heating units HT1 and HT2 heat the wafer W to a predetermined temperature in the load-lock modules LL1 and LL2, respectively. A pressure in each of the load-lock modules LL1 and LL2 can be switched between a vacuum atmosphere and an atmospheric atmosphere of, e.g., nitrogen ($N_2$) gas.

The loader module LM is provided at sides of the load-lock modules LL1 and LL2 which are opposite to sides connected to the transfer module TM. The loader module LM is a horizontally (X direction in FIG. 1) elongated box-shaped module. Load ports LP1 to LP3 are provided at a longitudinal side surface of the loader module LM which is opposite to a side surface connected to the load-lock modules LL1 and LL2. FOUPs (Front-Opening Unified Pods) FP, each being a delivery container capable of accommodating a plurality of (e.g., 25) wafers in shelves, are mounted on the load ports LP1 to LP3. A transfer unit LR is provided in the loader module LM. The transfer unit LR transfers the wafer between the FOUP FP and an aligner AU, between the aligner AU and the load-lock module LL1 or LL2, and between the load-lock module LL1 or LL2 and the FOUP FP. In the loader module LM, there is provided the aligner AU for adjusting a position of the wafer W loaded into the loader module LM from the FOUP FP.

Gate valves G1 and G2 are provided between the transfer module TM and the process modules PM1 and PM2, respectively. By opening the gate valve G1 or G2, the transfer module TM communicates with the process module PM1 or PM2, respectively.

Gate valves G3 and G4 are provided between the transfer module TM and the load-lock modules LL1 and LL2, respectively. By opening the gate valve G3 or G4, the transfer module TM communicates with the load-lock module LL1 or LL2.

Gate valves G5 and G6 are provided between the load-lock modules LL1 and LL2 and the loader module LM, respectively. By opening the gate valve G5 or G6, the load-lock module LL1 or LL2 communicates with the loader module LM, respectively.

Opening/closing doors D1 to D3 are provided between the loader module LM and the load ports LP1 to LP3, respectively. By opening the opening/closing door D1, D2 or D3, the inside of the loader module LM communicates with the inside of the FOUP FP mounted on the load port LP1, LP2 or LP3.

The substrate processing system includes a controller MCU. The controller MCU controls operations of the transfer module TM, the process modules PM1 and PM2, the load-lock modules LL1 and LL2, and the loader module LM. Further, the controller MCU controls operations of the load ports LP1 to LP3, the aligner AU, the gate valves G1 to G6, and the opening/closing doors D1 to D3. The controller MCU may be connected to another device, a host computer or the like by a wired or a wireless communication device. The controller MCU includes a CPU (central processing unit), a ROM (read only memory), and a RAM (random access memory). The CPU performs processing on the wafer based on various recipes stored in storage area of the ROM and the RAM.

(Film Forming Apparatus)

Figure 2:
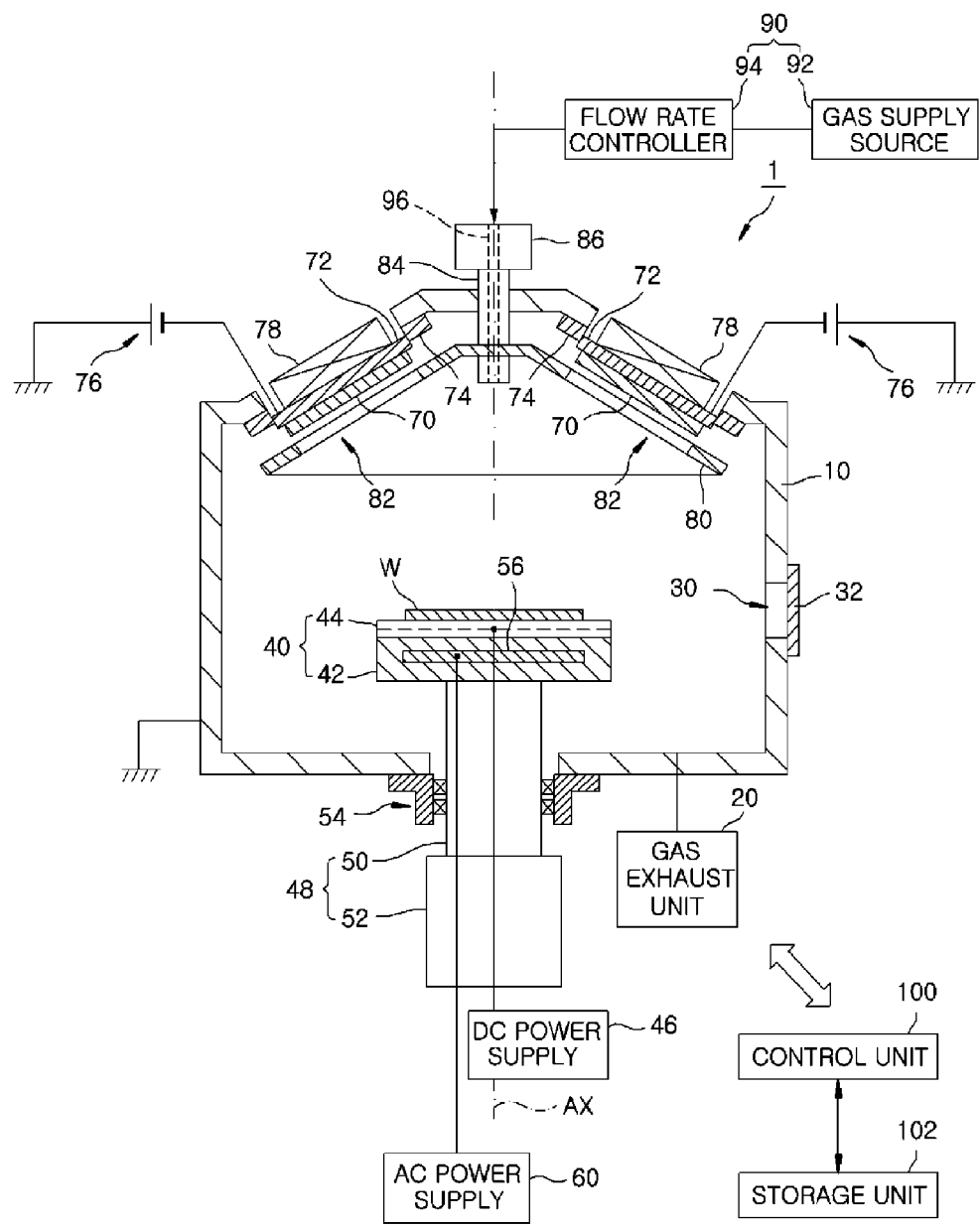
FIG. 2 schematically shows a film forming apparatus according to an embodiment.

The film forming apparatus according to an embodiment will be described. FIG. 2 schematically shows the film forming apparatus according to an embodiment. The film forming apparatus shown in FIG. 2 can be used as the process modules PM1 and PM2 in the above-described substrate processing system.

As shown in FIG. 2, the film forming apparatus 1 includes a processing chamber 10. The processing chamber 10 is made of, e.g., aluminum, and grounded. A gas exhaust unit 20 is connected to a bottom portion of the processing chamber 10. The gas exhaust unit 20 includes a vacuum pump such as a cryo pump, a water pump or the like, and decreases a pressure in the processing chamber 10 to a predetermined vacuum level. A gate valve 32 for opening/closing a transfer port 30 through which a wafer W is loaded/unloaded is provided at a sidewall of the processing chamber 10.

A mounting table 40 for mounting thereon the wafer W is provided in the processing chamber 10. The mounting table 40 includes a base 42 and an electrostatic chuck 44. The base 42 is made of, e.g., aluminum, and has a substantially disc shape. The electrostatic chuck 44 is provided on a top surface of the base 42. The wafer W is held on the electrostatic chuck 44 by an electrostatic attraction force. The electrostatic chuck 44 has a structure in which an electrode made of a conductive film is interposed between two dielectric films. A DC power supply 46 is connected to the electrode of the electrostatic chuck 44. The wafer W is attracted and held on the electrostatic chuck 44 by an electrostatic force generated by a voltage applied from the DC power supply 46.

The mounting table 40 is connected to a driving mechanism 48. The driving mechanism 48 includes a rotation shaft 50 and a driving unit 52. The rotation shaft 50 is a substantially columnar member. A central axis of the rotation shaft 50 substantially coincides with an axis AX extending along a vertical direction. The axis AX passes through a center of the mounting table 40 in the vertical direction. The rotation shaft 50 extends from a bottom portion of the mounting table 40 to the outside of the processing chamber 10 while penetrating through the bottom portion of the processing chamber 10. A seal member 54 such as a magnetic fluid seal or the like is provided between the rotation shaft 50 and the bottom portion of the processing chamber 10. The seal member 54 seals a space between the bottom portion of the processing chamber 10 and the rotation shaft 50 such that the rotation shaft 50 can rotate and move up and down.

The mounting table 40 is attached to an upper end of the rotation shaft 50. The driving unit 52 is attached to a lower end of the rotation shaft 50. The driving unit 52 generates power for rotating and moving up and down the rotation shaft 50. The mounting table 40 rotates about the axis AX when the rotation shaft 50 rotates by power of the driving unit 52. Further, the mounting table 40 moves up and down when the rotation shaft 50 moves up and down by the power of the driving unit 52. The rotation shaft 50 may be formed as one unit with the mounting table 40. The mounting table 40 may rotate at a speed of, e.g., 60 rpm to 120 rpm.

A heater 56 is buried in the base 42 of the mounting table 40, so that the mounting table 40 can be heated. Further, the heater 56 may be buried in the electrostatic chuck 44 or may be configured as a sheet-type heater that can be attached to the mounting table 40. The heater 56 may be divided into a plurality of regions. When the heater 56 is divided into a plurality of regions, the temperature of the mounting table 40 can be controlled on a divided area basis.

An AC power supply 60 is connected to the heater 56. By supplying power from the AC power supply 60 to the heater 56, the mounting table 40 (wafer W) can be controlled to a predetermined temperature.

One or more targets 70 are provided above the mounting table 40. The target 70 is made of, e.g., cobalt. In one embodiment, four targets 70 are provided. The targets 70 are arranged along a circular arc about the axis AX. The number of the targets 70 is not limited to four and may be any number greater than or equal to one.

Each of the targets 70 is held by a holder 72 made of a metal. The holder 72 is supported at a ceiling portion of the processing chamber 10 through an insulating member 74. Power supplies 76 are respectively connected to the targets 70 via the holders 72. The power supplies 76 apply a negative DC voltage to the respective targets 70. The power supplies 76 may be configured as a single power supply for selectively applying a voltage to the multiple targets 70 or as a plurality of power supplies respectively connected to the multiple targets 70. Magnets 78 may be provided at the outside of the processing chamber 10 to correspond to the targets 70 through the holders 72, respectively.

A shutter 80 is provided between the mounting table 40 and the targets 70. The shutter 80 extends to face surfaces of the targets 70. In one embodiment, the shutter 80 has a shape conforming to a conical surface having the axis AX as a central axis.

An opening 82 is formed in the shutter 80. A rotation shaft 84 is connected to a central portion of the shutter 80. The rotation shaft 84 is a substantially columnar member. A central axis of the rotation shaft 84 substantially coincides with the axis AX. A lower end portion of the rotation shaft 84 is connected to the central portion of the shutter 80 in the processing chamber. Further, the rotation shaft 84 extends from the inside of the processing chamber to the outside of the processing chamber 10 while penetrating through the ceiling portion of the processing chamber 10. An upper end of the rotation shaft 84 is connected to a driving unit 86 at the outside of the processing chamber 10. The driving unit 86 generates power for rotating the rotation shaft 84. The shutter 80 rotates about the axis AX when the rotation shaft 84 rotates about the axis AX by the power of the driving unit 86. Due to the rotation of the shutter 80, relative positions of the targets 70 with respect to the opening 82 are changed. Accordingly, the targets 70 are shielded from the mounting table 40 by the shutter 80 or exposed to the mounting table 40 through the openings 82 of the shutter 80.

The film forming apparatus 1 includes a gas supply unit 90 for supplying a gas into the processing chamber 10. The gas supply unit 90 includes a gas supply source 92, a flow rate controller 94 such as a mass flow controller or the like, and a gas inlet 96. The gas supply source 92 is a supply source of a gas to be excited in the processing chamber 10. For example, the gas supply source 92 is a supply source of a rare gas, e.g., Ar gas or the like. The gas supply source 92 is connected to the gas inlet 96 via the flow rate controller 94. The gas inlet 96 is a gas line for introducing a gas from the gas supply source 92 into the processing chamber 10. The gas inlet 96 is provided along the axis AX.

When the gas is supplied from the gas supply unit 90 into the processing chamber 10 and the voltage is applied to the targets 70 by the power supplies 76, the gas supplied into the processing chamber 10 is excited and a magnetic field is generated near the targets 70 by the magnets 78. Therefore, a plasma is concentrated near the targets 70 and positive ions in the plasma collide with the targets 70. Accordingly, target materials are sputtered from the exposed targets 70. The sputtered target materials are deposited on the wafer W, thereby forming a thin film.

The film forming apparatus 1 includes a control unit 100 such as a computer or the like for controlling the entire operation of the film forming apparatus 1. The control unit 100 controls operations of the respective units of the film forming apparatus 1, e.g., the gas exhaust unit 20, the DC power supply 46, the driving mechanism 48, the AC power supply 60, and the gas supply unit 90.

The control unit 100 is connected to a storage unit 102 that stores control programs for realizing various processes performed in the film forming apparatus 1 under the control of the control unit 100 or various programs for allowing the respective units of the film forming apparatus 1 to perform processes based on a processing condition. The various programs may be stored in the storage unit 102 while being stored in a storage medium. The storage medium may be a hard disk or a semiconductor memory, or may be a portable device such as a CD-ROM, a DVD, a flash memory or the like. Alternatively, the various programs may be appropriately transferred from another device or a host computer through a wired or a wireless communication device.

(Vacuum Exhaust Method)

Figure 3:
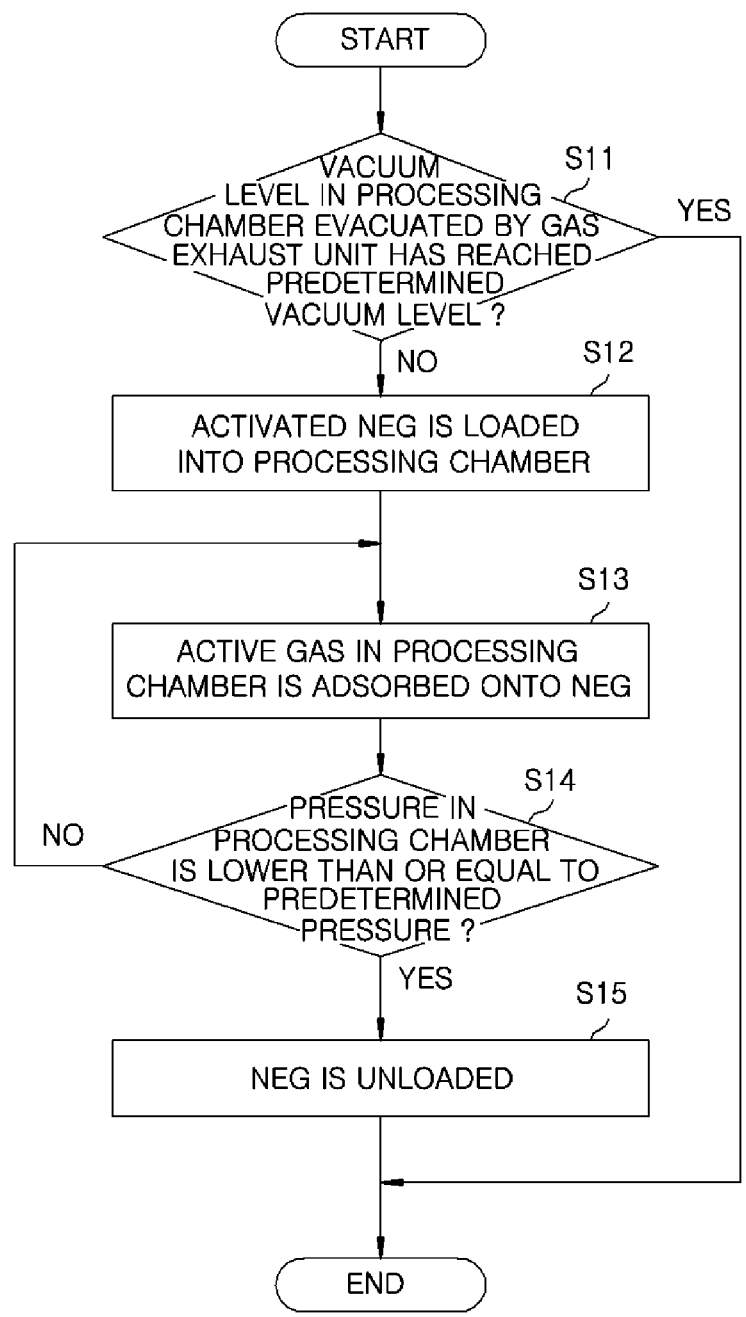
FIG. 3 is a flowchart showing a vacuum exhaust method according to an embodiment.

A vacuum exhaust method according to an embodiment will be described. FIG. 3 is a flowchart showing the vacuum exhaust method according to an embodiment.

First, the control unit 100 determines whether or not a vacuum level in the processing chamber 10 evacuated by the gas exhaust unit 20 has reached a predetermined vacuum level (step S11). The predetermined vacuum level may be determined by, e.g., types of the vacuum pump included in the gas exhaust unit 20 or types of processing performed in the film forming apparatus 1.

If the control unit 100 determines in the step S11 that the vacuum level in the processing chamber 10 has reached the predetermined vacuum level, the processing is completed. If the control unit 100 determines in the step S11 that the vacuum level in the processing chamber 10 has not reached the predetermined vacuum level, an activated NEG is loaded into the processing chamber 10 and mounted on the mounting table 40 (step S12).

Next, the active gas in the processing chamber 10 is adsorbed onto the NEG (step S13). At this time, as for the active gas, it is possible to use, e.g., $H_2O$, $CO$, $CO_2$, $O_2$, $N_2$ or the like.

Next, the control unit 100 determines whether or not a pressure in the processing chamber 10 is lower than or equal to a predetermined pressure (step S14). The predetermined pressure may be determined by, e.g., types of the vacuum pump included in the gas exhaust unit 20 or types of processing performed in the film forming apparatus 1.

If the control unit 100 determines in the step S14 that the pressure in the processing chamber 10 is lower than or equal to the predetermined pressure, the NEG is unloaded from the processing chamber 10 (step S15) and the processing is completed. If the control unit 100 determines in the step S14 that the pressure in the processing chamber 10 is not lower than or equal to the predetermined pressure, the processing returns to the step S13 and the adsorption of the active gas onto the NEG in the processing chamber 10 is continued.

As described above, in the vacuum exhaust method according to an embodiment, the NEG is loaded into the processing chamber 10 that can be evacuated by the gas exhaust unit 20 and the active gas in the processing chamber 10 is adsorbed onto the NEG. Accordingly, the vacuum level in the processing chamber 10 can be improved.

In the above example, there has been described the case in which the NEG is loaded into the processing chamber 10 when the vacuum level in the processing chamber 10 has not reached the predetermined vacuum level. However, the NEG may be loaded into the processing chamber regularly (at a preset time interval).

Next, a case in which a vacuum level of the process module PM1 of the substrate processing system is improved by using the vacuum exhaust method according to an embodiment will be described as an example.

Figure 4A:
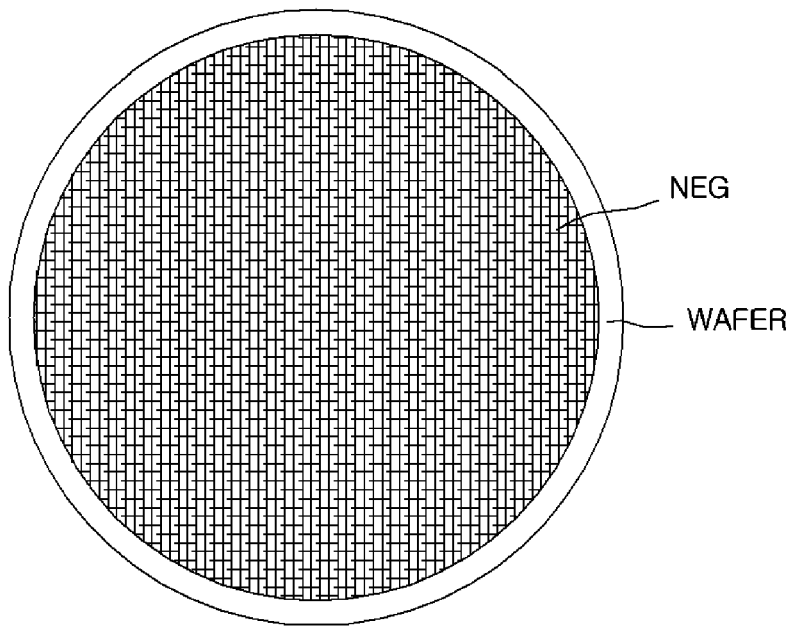
FIGS. 4A and 4B explain an example of a wafer onto which a non-evaporated getter (NEG) is bonded.
Figure 4B:
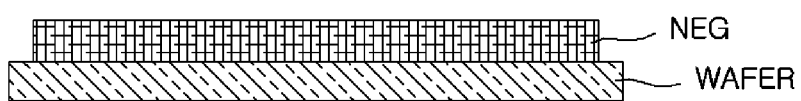

First, the NEG will be described. FIGS. 4A and 4B explain an example of a wafer onto which an NEG is bonded. FIG. 4A is a top view and FIG. 4B is a cross sectional view.

As shown in FIGS. 4A and 4B, the NEG is formed in a wafer shape and bonded to a surface of the wafer to be subjected to the processing in the film forming apparatus 1 which is opposite to a surface of the wafer mounted on the mounting table 40. Therefore, the effect of metal contamination on parts (e.g., the transfer unit LR, the transfer unit TR, and the mounting table 40) in contact with the NEG can be suppressed. The wafer is, e.g., a silicon wafer. When the metal contamination or the like does not occur, the NEG may be used as a single body without being bonded onto the wafer. In the case of using the NEG as a single body, the NEG preferably has substantially the same shape as that of the wafer so that it can be easily transferred into the processing chamber 10.

Hereinafter, a case in which an NEG having a wafer shape and stored in an atmospheric atmosphere is used as the NEG will be described as an example with reference to FIG. 1.

First, the FOUP FP in which the NEG is accommodated is mounted on the load port LP1.

Next, the NEG is unloaded from the FOUP FP and transferred to the aligner AU by the transfer unit LR of the loader module LM. In the aligner AU, the NEG is position-aligned. The position alignment of the NEG by the aligner AU may be omitted.

Next, the NEG is unloaded from the aligner AU and transferred to the load-lock module LL1 by the transfer unit LR of the loader module LM. In the load-lock module LL1, the NEG is activated by heating the NEG to a predetermined temperature by the heating unit HT1 (activation step). The predetermined temperature may be a temperature at which the NEG is activated (hereinafter, referred to as "activation temperature"). For example, the predetermined temperature may be 400° C. to 500° C. when the NEG is made of a ZrVFe alloy.

Next, the NEG is unloaded from the load-lock module LL1, transferred to the process module PM1 (film forming apparatus 1) and mounted on the mounting table 40 in the processing chamber 10 by the transfer unit TR of the transfer module TM (mounting step). In the film forming apparatus 1, the active gas in the processing chamber 10 is adsorbed onto the NEG until a pressure in the processing chamber 10 becomes lower than or equal to a predetermined pressure (adsorption step). At this time, a temperature of the activated NEG in the processing chamber 10 is adjusted to a temperature at which the active gas can be adsorbed (hereinafter, referred to as "adsorbable temperature"). The adsorbable temperature is lower than the activation temperature. For example, the adsorbable temperature may be 200° C. when the NEG is made of a ZrVFe alloy. In the adsorption step, it is preferable to maintain the temperature of the NEG at the adsorbable temperature. Accordingly, the active gas in the processing chamber 10 can be effectively adsorbed onto the NEG.

Next, the NEG is unloaded from the process module PM1 (unloading step) and transferred to the load-lock module LL1 by the transfer unit TR of the transfer module TM.

Next, the NEG is unloaded from the load-lock module LL1 and transferred to the FOUP FP by the transfer unit LR of the loader module LM.

Accordingly, the vacuum level in the process module PM1 can be improved.

In the above example, the case in which the vacuum level of the process module PM1 is improved has been described. The vacuum level in the process module PM2 can also be improved in the same manner.

Further, in the above example, the case in which the NEG is activated in the load-lock module LL1 has been described. However, as long as the NEG is activated before the adsorption step, the NEG may be activated in the process module PM1 or in another module. Or, the NEG that is stored in an activated state under a vacuum atmosphere may be used. In that case, the step of activating the NEG may be omitted. For example, when the substrate processing system has a storage capable of storing NEG under the vacuum atmosphere, activated NEG may be stored in the storage.

In the above example, the case in which the temperature of the NEG in the process module PM1 is adjusted to the adsorbable temperature has been described. However, it is not limited thereto, and the temperature of the NEG may be adjusted to the adsorbable temperature in another module, e.g., the load-lock module LL1 or the like. When the substrate processing system includes a cooling module capable of cooling the wafer W, it is preferable to adjust a temperature of the NEG to the adsorbable temperature in the cooling module. Accordingly, the high temperature of the NEG that has been heated for activation can be adjusted to the adsorbable temperature within a short period of time.

In the above example, the case in which the vacuum level in the process module PM1 is improved has been described. However, the method of the present disclosure may be used to improve a vacuum level in the transfer module TM, the load-lock modules LL1 and LL2, or the like.

As described above, the vacuum exhaust method according to an embodiment improves the vacuum level in the processing chamber by loading the NEG into the processing chamber that can be evacuated by the gas exhaust unit and adsorbing the active gas in the processing chamber onto the NEG. Therefore, the vacuum level in the processing chamber can be improved without adding a new vacuum pump and baking the processing chamber. As a result, the vacuum level in the processing chamber can be improved within a short period of time.

In the vacuum exhaust method according to an embodiment, the active gas in the processing chamber can be adsorbed onto the NEG by heating the NEG to a predetermined temperature by using the conventional heating unit such as a heater or the like of the substrate processing system. Accordingly, it is not necessary to add a new device to the substrate processing system.

While the disclosure has been shown and described with respect to the embodiments, it will be understood by those skilled in the art that various changes and modifications may be made without departing from the scope of the disclosure as defined in the following claims.

What is claimed is:

1. A vacuum exhaust method for decreasing a pressure in a processing chamber, in which a mounting table configured to mount thereon a substrate is provided, by using a gas exhaust unit, the method comprising:
    mounting a non-evaporated getter (NEG) on the mounting table; and
    adsorbing an active gas in the processing chamber on the NEG mounted on the mounting table,
    wherein said mounting the NEG is performed when a vacuum level in the processing chamber does not reach a predetermined vacuum level in a state where a pressure in the processing chamber is decreased by the gas exhaust unit.

2. The vacuum exhaust method of claim 1, wherein in said adsorbing the active gas, the NEG is maintained at a predetermined temperature.

3. The vacuum exhaust method of claim 1 further comprising: before said mounting the NEG, activating the NEG.

4. The vacuum exhaust method of claim 2 further comprising: before said mounting the NEG, activating the NEG.

5. The vacuum exhaust method of claim 1, wherein in said mounting the NEG, the NEG to be mounted on the mounting table is stored in an activated state under a vacuum atmosphere.

6. The vacuum exhaust method of claim 2, wherein in said mounting the NEG, the NEG to be mounted on the mounting table is stored in an activated state under a vacuum atmosphere.

7. The vacuum exhaust method of claim 1 further comprising: after said adsorbing the active gas, unloading the NEG from the processing chamber,
   wherein said unloading the NEG is performed after a pressure in the processing chamber becomes lower than or equal to a predetermined pressure.

8. The vacuum exhaust method of claim 1, wherein the predetermined vacuum level is determined depending on types of the gas exhaust unit.

9. The vacuum exhaust method of claim 1, wherein the gas exhaust unit includes a cryo pump or a water pump.

10. The vacuum exhaust method of claim 1, wherein the NEG is formed in a wafer shape.

11. The vacuum exhaust method of claim 1, wherein the NEG is bonded onto a surface of a substrate to be subjected to processing in the processing chamber which is opposite to a surface of the substrate mounted on the mounting table.

12. The vacuum exhaust method of claim 1, wherein the NEG is made of a ZrVFe alloy.

\* \* \* \* \*